US009229336B2

United States Patent
Finders et al.

(10) Patent No.: US 9,229,336 B2
(45) Date of Patent: Jan. 5, 2016

(54) LITHOGRAPHIC APPARATUS AND METHODS FOR DETERMINING AN IMPROVED CONFIGURATION OF A LITHOGRAPHIC APPARATUS

(75) Inventors: Jozef Maria Finders, Veldhoven (NL); Bernardo Kastrup, Eindhoven (NL); Sander De Putter, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1016 days.

(21) Appl. No.: 13/359,244

(22) Filed: Jan. 26, 2012

(65) Prior Publication Data

US 2012/0194797 A1 Aug. 2, 2012

Related U.S. Application Data

(60) Provisional application No. 61/437,442, filed on Jan. 28, 2011.

(51) Int. Cl.
*G03B 27/68* (2006.01)
*G03F 7/20* (2006.01)

(52) U.S. Cl.
CPC ........ *G03F 7/70491* (2013.01); *G03F 7/70616* (2013.01)

(58) Field of Classification Search
CPC .. G03F 7/70491; G03F 7/70616; G03F 7/705
USPC ................................. 355/52, 77, 18
See application file for complete search history.

(56) References Cited

U.S. PATENT DOCUMENTS

| | | | | |
|---|---|---|---|---|
| 6,563,566 | B2 * | 5/2003 | Rosenbluth et al. | 355/67 |
| 7,307,690 | B1 * | 12/2007 | De Winter et al. | 355/53 |
| 8,910,089 | B1 * | 12/2014 | Barai et al. | 716/51 |
| 2005/0076323 | A1 | 4/2005 | Gau et al. | |
| 2005/0210438 | A1 * | 9/2005 | Verstappen et al. | 716/21 |
| 2005/0237506 | A1 * | 10/2005 | Reisinger et al. | 355/55 |
| 2006/0170898 | A1 * | 8/2006 | Finders | 355/69 |
| 2007/0031745 | A1 * | 2/2007 | Ye et al. | 430/30 |
| 2007/0050749 | A1 * | 3/2007 | Ye et al. | 716/20 |
| 2007/0059614 | A1 * | 3/2007 | Finders et al. | 430/30 |
| 2007/0061773 | A1 * | 3/2007 | Ye et al. | 716/21 |
| 2007/0188719 | A1 * | 8/2007 | Jaynes et al. | 353/94 |
| 2007/0268306 | A1 * | 11/2007 | Webb et al. | 345/600 |
| 2010/0122225 | A1 | 5/2010 | Cao et al. | |
| 2012/0099091 | A1 * | 4/2012 | Finders | 355/67 |

* cited by examiner

*Primary Examiner* — Deoram Persaud
(74) *Attorney, Agent, or Firm* — Pillsbury Winthrop Shaw Pittman LLP

(57) ABSTRACT

A method to determine an improved configuration for a lithography apparatus, a computer-readable medium for use in carrying out the method, and a lithography apparatus are disclosed. In an example, the method involves intelligent selection of one or more device features to measure and use in a routine to optimize the configuration of the lithography apparatus. According to an example, the method comprises imposing a target error profile to one or more device features for which measurement data is not sufficient, for example in a regions where a selected device feature is sparsely distributed.

20 Claims, 5 Drawing Sheets

LITHOGRAPHIC APPARATUS AND METHODS FOR DETERMINING AN IMPROVED CONFIGURATION OF A LITHOGRAPHIC APPARATUS This application claims priority and benefit under 35 U.S.C. §119(e) to U.S. Provisional Patent Application No. 61/437,442, filed on Jan. 28, 2011. The content of that application is incorporated herein in its entirety by reference.

FIELD

The present invention relates to a lithographic apparatus and a method to determine an improved configuration thereof.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

Imperfections in the patterning device can cause errors in the pattern transferred to the substrate, and thus in the circuit pattern generated upon processing the substrate after exposure. Such errors may be characterized by a variation in a parameter representing the quality of the pattern as function of position on the substrate, for example. A critical dimension may be used as such a parameter, the critical dimension being defined as a dimension of a specified geometry, for example the width of a patterned line or the distance between two lines.

If the spatial variation in the quality of the pattern can be predicted, the configuration of the lithographic apparatus can be adapted to reduce the variation. For example, one or more properties of the lithographic apparatus that define a maximum dose profile and/or depth of focus profile may be varied.

One approach to assessing the variation in the quality of the pattern on the patterning device is to compare a property (for example measure a critical dimension) of different instances of a device feature that is repeated across the device pattern to be formed (which corresponds to the pattern on the patterning device in a manner which depends on the particular way the device pattern is to be transferred to the substrate).

The effectiveness of an adjustment procedure based on this approach can depend strongly on the choice of which type of device feature to analyze, and the way instances of that type of device feature are distributed throughout the device pattern. In particular, the adjustment procedure may not be appropriate for regions in the device pattern where the device feature does not occur or does not occur sufficiently frequently. The adjustment procedure may even lead to a reduction in the quality of the device pattern in such regions.

It is desirable, for example, to improve the manner in which the configuration of a lithography apparatus is adapted to correct for an error in a patterning device.

According to an aspect of the invention, there is provided a method for determining an improved configuration for a lithography apparatus, comprising: analyzing a target device pattern to be imaged on a substrate by a lithography apparatus to identify a plurality of instances of a candidate device feature in the target device pattern; repeating the analyzing step for a different candidate device feature; selecting the candidate device feature for which the plurality of instances identified in the analyzing step matches a selection criterion or criteria; measuring a device pattern produced using the lithography apparatus, or measuring a patterning device for use in the lithography apparatus, in order to obtain a set of errors comprising differences between a measured value of a particular property of each instance of the identified plurality of instances of the selected device feature and a target value for the property; and adapting the configuration of the lithographic apparatus to improve the set of errors.

According to an aspect of the invention, there is provided a computer-readable medium comprising code to instruct a computer to carry out a method for determining an improved configuration of a lithography apparatus, the method comprising: analyzing a target device pattern to be imaged on a substrate by a lithography apparatus to identify a plurality of instances of a candidate device feature in the target device pattern; repeating the analyzing step for a different candidate device feature; selecting the candidate device feature for which the plurality of instances identified in the analyzing step matches a selection criterion or criteria; obtaining data from measurements of a device pattern produced using the lithography apparatus, or from measurements of a patterning device for use in the lithography apparatus, comprising a set of errors comprising differences between a measured value of a particular property of each instance of the identified plurality of instances of the selected device feature and a target value for the property; and adapting the configuration of the lithographic apparatus to improve the set of errors.

According to an aspect of the invention, there is provided a lithography apparatus comprising: a support constructed to support a patterning device, the patterning device being capable of imparting the radiation beam with a pattern in its cross-section to form a patterned radiation beam; a projection system configured to project the patterned radiation beam onto a target portion of a substrate; and a configuration optimizer configured to optimize the configuration of the lithography apparatus, the configuration optimizer comprising: an analyzer configured to analyze a target device pattern to be imaged on a substrate by the lithography apparatus to identify a plurality of instances of a candidate device feature in the target device pattern, and repeat the analyzing step for a different candidate device feature; a selector configured to select the candidate device feature for which the plurality of instances identified in the analyzing step matches a selection criterion or criteria; a measuring device configured to measure a device pattern produced using the lithography apparatus, or measure a patterning device for use in the lithography apparatus, in order to obtain a set of errors comprising differences between a measured value of a particular property of each instance of the identified plurality of instances of the selected device feature and a target value for the property; and a fitting module configured to adapt the configuration of the lithography apparatus to improve the set of errors.

According to an aspect of the invention, there is provided a method for determining an improved configuration for a lithography apparatus, the method comprising: analyzing a target device pattern to be imaged on a substrate by a lithography apparatus to identify a plurality of instances of a device feature in the target device pattern; measuring a device pattern produced using the lithography apparatus, or measuring a patterning device for use in the lithography apparatus, in order to obtain a set of errors comprising the differences between a measured value of a particular property of each instance of the plurality of instances and a target value for the property; and adapting the configuration of the lithography apparatus to improve the set of errors, the adapting being carried out in a manner that satisfies a constraint or target, the constraint or target being that an error profile, applicable at instances of a device feature other than the instances for which errors are obtained in the measuring step, approaches a target error profile.

According to an aspect of the invention, there is provided a computer-readable medium comprising code to instruct a computer to carry out a method for determining an improved configuration of a lithography system, comprising: analyzing a target device pattern to be imaged on a substrate by a lithography apparatus to identify a plurality of instances of a device feature in the target device pattern; obtaining data from measurements of a device pattern produced using the lithography apparatus, or from measurements of a patterning device for use in the lithography apparatus, comprising a set of errors comprising differences between a measured value of a particular property of each instance of the plurality of instances and a target value for the property; and adapting the configuration of the lithography apparatus to improve the set of errors, the adapting being carried out in a manner that satisfies a constraint or target, the constraint or target being that an error profile, applicable at instances of a device feature other than the instances for which errors are obtained in the measuring step, approach a target error profile.

According to an aspect of the invention, there is provided a lithography apparatus comprising: a support constructed to support a patterning device, the patterning device being capable of imparting the radiation beam with a pattern in its cross-section to form a patterned radiation beam; a projection system configured to project the patterned radiation beam onto a target portion of a substrate; and a configuration optimizer to optimize the configuration of the lithography apparatus, the configuration optimizer comprising: an analyzer configured to analyze a target device pattern to be imaged on a substrate by the lithography apparatus to identify a plurality of instances of a device feature in the target device pattern; a measuring device configured to measure a device pattern produced using the lithography apparatus, or measure a patterning device for use in the lithography apparatus, in order to obtain a set of errors comprising differences between a measured value of a particular property of each instance of the identified plurality of instances of the device feature and a target value for the property; and a fitting module configured to adapt the configuration of the lithography apparatus to improve the set of errors, the adapting being carried out in a manner that satisfies a constraint or target, the constraint or target being that an error profile, applicable at instances of a device feature other than the instances for which errors are obtained in the measuring step, approaches a target error profile.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
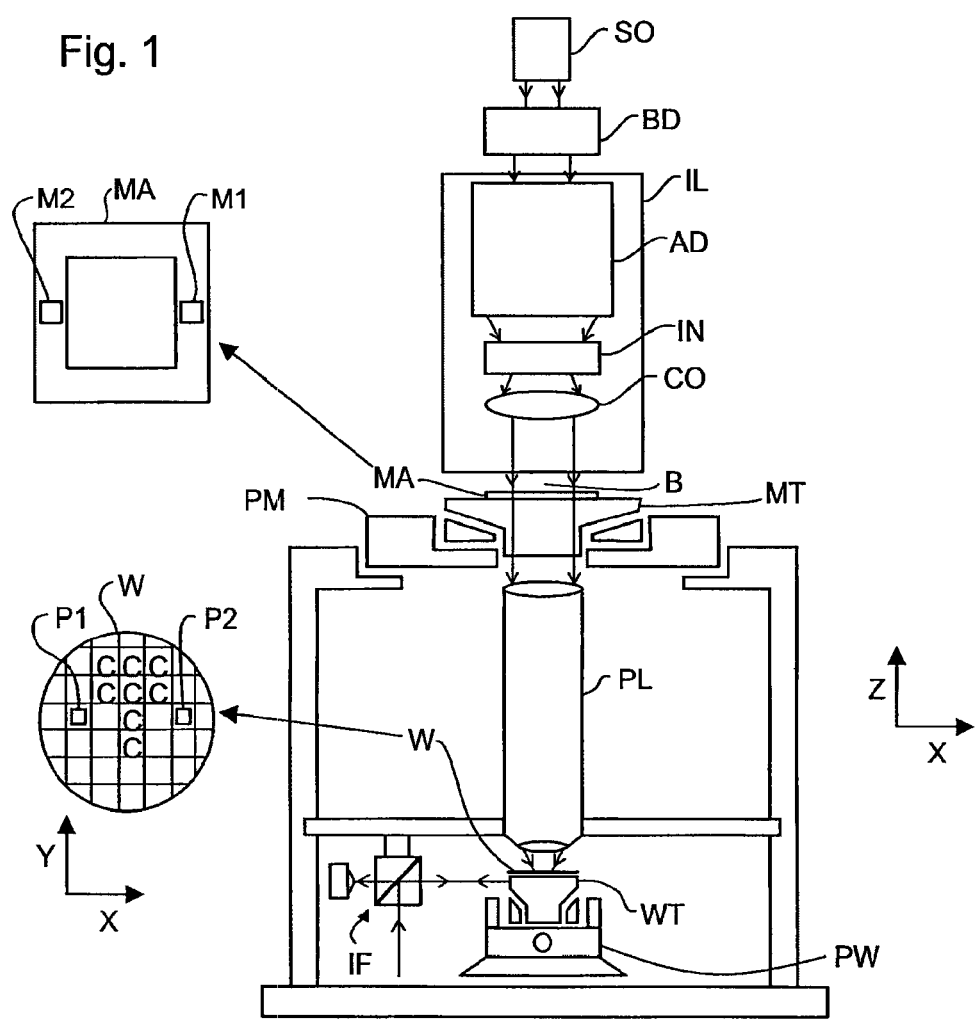
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT hold the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned above, an imperfection in the pattern on the patterning device MA may cause an error in the device pattern that is transferred to the substrate W. Such an error can be estimated by measuring the error on the patterning device MA or by measuring the error on a substrate W that has been patterned using the patterning device MA. However, it is not practical to measure the error, if any, associated with every feature that is present on the patterning device MA because of the very large number of features involved (typically $>10^6$). In general, it is efficient to choose a given type of device feature and locate different instances of that device feature in the device pattern. A property of each of the different instances (such as a critical dimension) is obtained and compared with a target value. In this way, it is possible to construct a map of errors (deviations from the target value) across the device pattern, with a data point (representing an error) at the position of each instance of the device feature measured.

Once this map has been obtained, a computer algorithm can be used to vary the configuration of the lithography apparatus to minimize the error at each of the points considered. If these points are sufficiently representative of the whole device pattern, the new configuration will allow the lithography apparatus to produce a device pattern that is a better match to the target device pattern.

In general, the new configuration will tend to improve the device pattern in the case where one or more device features are chosen that happen to be distributed widely, densely and/or uniformly across the pattern. However, if the selected one or more device features are not well distributed, the correction procedure may not work well, particularly for those one or more regions of the device pattern where the selected device feature is not present at all, or is not present at a sufficient density. Indeed, in many circumstances, the quality of the device pattern in such a region may be made considerably worse by the correction process.

According to disclosed embodiments, an improvement is obtained by providing a system to automatically select one or more optimal device features on which to base the correction processing.

Figure 2:
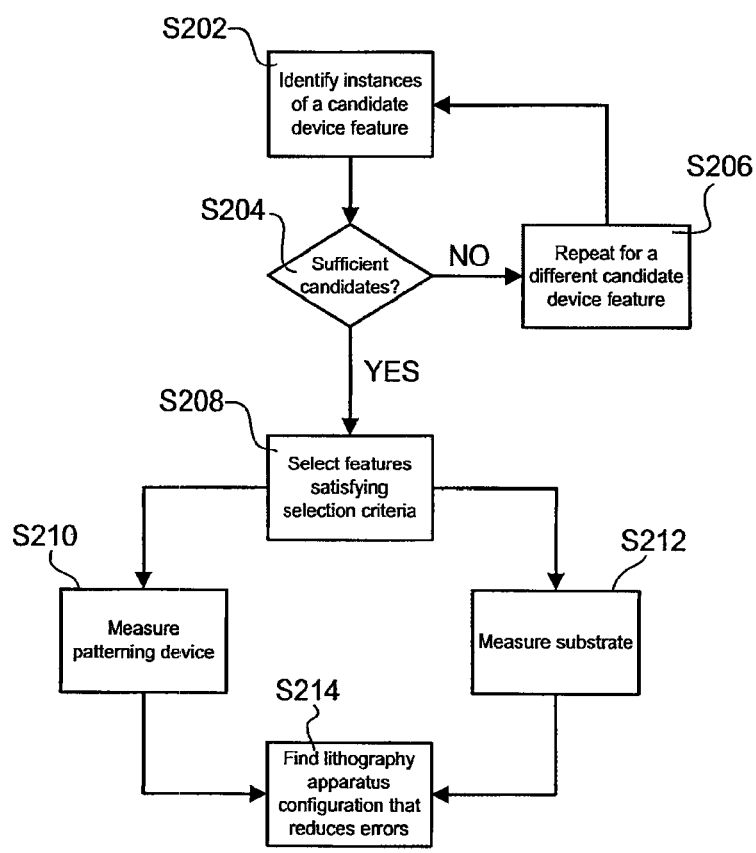
FIG. 2 depicts an example process to obtain an improved configuration for a lithography apparatus, wherein the device features to be measured and used as input in an optimization phase are selected according to a selection criterion or criteria.

FIG. 2 illustrates an example methodology. In step S202, a target device pattern to be formed on a substrate by a given lithography apparatus is analyzed in order to identify a plurality of instances of a candidate device feature. Any number of the instances may be chosen, for example between about 10 and about 1000, desirably between about 25 and about 250. The process is repeated (steps S204 and S206) for one or more different candidate features (i.e. candidate features which are of a different type, each requiring a different radiation pattern to be formed) until pluralities of instances have been obtained for a desired number of different candidate features. Examples of different candidate features might include different portions of a structure to be formed, such as a portion of a wall structure, a corner structure, or a gap between two structures.

In step S208, each of the pluralities of instances of the candidate device features is compared with one or more selection criteria in order to determine which of the candidate device features would be particularly efficient for use in determining an optimum configuration for the lithography apparatus.

The process then passes to step S210 and/or S212, where measurements are carried out to determine a set of differences (also referred to as a set of errors) between a measured value for a particular property (e.g. a critical dimension) of each instance of the device feature (or features) selected in step S208 and a target value for the property. Where the particular property is a critical dimension, the set of errors will be a set of deviations in the critical dimension.

In step S210 the set of errors are obtained by measuring the patterning device MA that is to be used by the lithography apparatus, in particular the portions of the pattern on the patterning device MA that correspond to each of the instances of the selected device feature (or features) that is to be considered. This analysis may comprise all of the instances or a subset of the instances. The nature of the process by which the pattern on the patterning device MA is to be transferred to the substrate W by the lithography apparatus is taken into account when deriving the set of errors (e.g. the set of deviations in the critical dimension) from the measurements of the patterning device MA. For example, the current configuration of the lithography apparatus (including parameters that influence dose profile, focus depth profile, magnification, etc.) and the mode of transfer may be taken into account. Where the pattern on the patterning device MA is simply a scaled version of the device pattern (i.e. the pattern to be formed on the substrate W), the set of errors can be determined relatively directly. Otherwise, a computer simulation of the lithography process may have to be performed in order to determine the relationship between the measured portions of the patterning device MA and the corresponding portions of the device pattern.

In step S212, the set of errors is obtained by measuring a processed substrate W (or a set of processed substrates), after exposure by the lithography apparatus and subsequent processing.

In step S214 an optimization routine (which may also be referred to as an optimization algorithm, fitting routine, optimization step, or iteratively varying step, for example) is performed to determine a configuration of the lithography apparatus that improves the set of errors. This process may involve iteratively varying the configuration of the lithography apparatus until the set of errors falls within acceptable bounds or until it is deemed that no significant further improvement in the set of errors is possible. For example, a metric representing a property of the set of errors may be defined (such as the average size of the error) and the iteration process configured to continue until the metric falls below (or above, depending on the nature of the metric) a particular threshold.

According to a disclosed variation, a set of local deviations in a particular property of a simulated patterned radiation beam produced by the lithography apparatus that would correct the set of errors associated with the instances of the device feature (or features) selected in step S208 is determined. The optimization routine can then be configured to vary one or more parameters of the lithography apparatus that influence the particular property of the simulated patterned radiation beam until a best fit to the set of local deviations is obtained.

For example, the set of local deviations may comprise deviations in the maximum dose that the lithography apparatus is configured to impart at each of the instances of the selected device feature (or features). The critical dimension depends on the value of the maximum dose, so varying the maximum dose in the region of the instance can be used to correct (or at least reduce) an error in the critical dimension. The maximum radiation dose is defined as the radiation dose corresponding to the value "1" in the case where the distribution of radiation dose within the exposure field is normalized so as to vary between 0 and 1 (the device pattern defining the particular spatial modulation, i.e. the positions of the 0s and 1s, and any intermediate values or gradients). Increasing the maximum dose thus has the effect of proportionally increasing the dose at all positions in the dose pattern to be formed on the substrate, except the positions corresponding to zero dose. The maximum dose profile can be adjusted by changing the intensity of the radiation beam, before and/or after it has interacted with the patterning device MA. The maximum radiation dose can be made to vary across the exposure field, thus providing flexibility for correcting the set of errors. The variation of the maximum radiation dose as a function of position across the substrate W may also be referred to as the maximum radiation dose profile, dose fingerprint, or simply dose profile, but is not to be confused with the dose pattern imparted by the patterning device MA; the maximum radiation dose profile depends only on the settings of the lithography apparatus and is independent of the patterning device MA.

Alternatively or additionally, the set of local deviations may comprise deviations in the depth of focus of the patterned radiation beam produced by the lithography apparatus (i.e. the position of the focus parallel to the Z-axis, perpendicular to the substrate W). Again, the critical dimension of a given instance of a device feature can be varied by changing the depth of focus at the position of the instance, so the depth of focus can be used to correct a set of errors in the critical dimension. Again, the depth of focus can be made to vary across the exposure field, thus providing flexibility for correcting the set of errors. The variation of the depth of focus as a function of position across the substrate W may also be referred to as the depth of focus profile, or simply focus profile.

The one or more parameters of the lithography apparatus that are varied during the optimization routine S214 may include one or more settings of the illumination system (illuminator) IL and/or one or more settings that define the numerical aperture of the system. Variation of such a parameter is likely to have an effect which varies in magnitude as a function of the type of device feature considered. In other words, some device features will be more sensitive than others to variations in such parameters. This variability may provide greater flexibility to the optimization process.

There are a variety of possible approaches and combinations of approaches that can be used to carry out the selection process of step S208. A selection of examples are described below.

According to one example approach, for each of the candidate device features analyzed in step S208 the following two steps are carried out: 1) a set of errors comprising the differences between a measured value for a particular property (e.g. critical dimension) of each instance of the candidate device feature and a target value for the property is determined (using the approaches described above with reference to steps S210 and S212 for example); and 2) the set of local deviations in a property (e.g. maximum dose or depth of focus) of a simulated patterned radiation beam produced by the lithography apparatus that would correct the set of errors associated with the candidate device feature is determined. Then, a selection criterion or criteria based on a property of the set of local deviations is obtained (for use in step S208 either solely or in combination with one or more other selection criteria).

For example, the selection criterion or criteria may comprise one or more of the following: that the set of local deviations (e.g. the determined shifts in dose or focus for the various instances involved) for the candidate feature comprises a deviation that is larger than a particular threshold; and/or that the set of local deviations for the candidate feature comprises an average deviation that is larger than an average deviation in the set of local deviations for any of the other candidate device features, or larger than a particular threshold. Such a selection criterion or criteria will thus favor the selection of a candidate device feature involving relatively large corrections, which will tend to improve the sensitivity of the fitting routine carried out in step S214 and thus the accuracy of the final fit.

Alternatively or additionally, the selection criterion or criteria may comprise one or more of the following: that the difference between the smallest deviation and the largest deviation in the set of local deviations for the candidate feature is larger than a particular threshold; and/or that the difference between the smallest deviation and the largest deviation in the set of local deviations for the candidate feature is larger than the difference between the smallest deviation and the largest deviation in the set of local deviations for any of the other candidate features. Such a selection criterion or criteria will thus favor the selection of a candidate device feature that involves a relatively large range of different corrections, which will tend to improve the sensitivity of the fitting routine carried out in step S214 and thus the accuracy of the final fit.

Alternatively or additionally, the selection criterion or criteria may comprise one or more of the following: that the set of local deviations for the candidate feature comprises a deviation that is smaller than a particular threshold; and/or that the set of local deviations for the candidate feature comprises an average deviation that is smaller than an average deviation in the set of local deviations for any of the other candidate device features, or smaller than a particular threshold. Such a selection criterion or criteria will thus tend to favor the selection of candidate device features that involve a relatively small amount of correction. The use of such a device feature may be particularly effective in combination with one or more other device features that have been selected using a different criterion or criteria, for example a criterion or criteria that favor the selection of candidate device features that involve a relatively large amount of correction, so as to improve the variety of features that are used in the fitting.

Alternatively or additionally, the selection criterion or criteria may comprise one or more of the following: that the difference between the smallest deviation and the largest deviation in the set of local deviations for the candidate feature is smaller than a particular threshold; and/or that the difference between the smallest deviation and the largest deviation in the set of local deviations for the candidate feature is smaller than the difference between the smallest deviation and the largest deviation in the set of local deviations for any of the other candidate features. Such a selection criterion or criteria will thus favor the selection of a candidate device feature that involves a relatively small range of different corrections. The use of such a device feature may be particularly effective in combination with one or more other device features that have been selected using a different criterion or criteria, for example a criterion or criteria that favors the selection of a candidate device feature that involves a relatively large range of different corrections.

Alternatively or additionally, the selection criterion or criteria may be based directly on one or more properties of the measured set of errors, for example requiring that the mean or variance is higher or lower than a particular threshold.

The selection process of step S208 may be configured to select a single candidate device feature (i.e. a single type of device feature having a plurality of instances) or a plurality of candidate device features (each type having a plurality of instances). In the latter case, the fitting step S214 will need to deal with (i.e. improve/minimize) a corresponding plurality of sets of errors (one set of errors for each selected device feature).

Alternatively or additionally, the selection criterion or criteria may comprise the requirement that the number of instances of the candidate device feature is higher than a particular threshold. In this way, the selection process of step S208 will favor features that represent a higher proportion of the device pattern, which will tend to represent global errors of the patterning device more accurately, particularly where the entropy or randomness of the device pattern is high or where the candidate device feature happens to be spread relatively evenly throughout the device pattern.

Alternatively or additionally, the selection criterion or criteria may comprise the requirement that the variance in the number of instances of the candidate device feature per unit area is lower than a particular threshold. In this way, the selection process of step S208 will favor features that are relatively evenly spread over the device pattern, which will tend to represent the errors in the patterning device more accurately and allow the fitting step S214 to find a configuration that produces an accurate device pattern over the whole of the substrate and not just in areas where the candidate device features happen to be located.

Alternatively or additionally, the selection criterion or criteria may comprise one or more of the following: 1) that the smallest, largest or average value of the sensitivity of the particular property (e.g. critical dimension) of each instance of the candidate device feature to a corrective change in the property (e.g. the local maximum dose or depth of focus) of the simulated patterned radiation beam is larger than a particular threshold; and/or 2) that the smallest, largest or average value of the sensitivity of the particular property of each instance of the candidate device feature to a corrective change in the property of the simulated patterned radiation beam is smaller than a particular threshold. For example, option (1) may be used to select a first set of features (representing high sensitivity) and option (2) may be used to select a second set of features (representing low sensitivity), with both the first and second sets of features being used in the optimization process. In this way, the range of properties sampled by the selected device feature is larger, which will tend to improve the accuracy of the optimization routine (leading to a better configuration and more accurate device pattern).

At least steps S202, S204, S206, S208, and S214 (steps S208 and S210 at least partially) can be carried out using a computer, the hardware associated with which (CPU, RAM, ROM, etc.) is well known to the skilled person. Software code may be provided to instruct the computer to carry out all of the steps that are required. The software code may be stored on a computer readable medium, such as RAM, ROM or a DVD, and supplied to the computer by means of a suitable reader, or by a data connection over a network.

Figure 3:
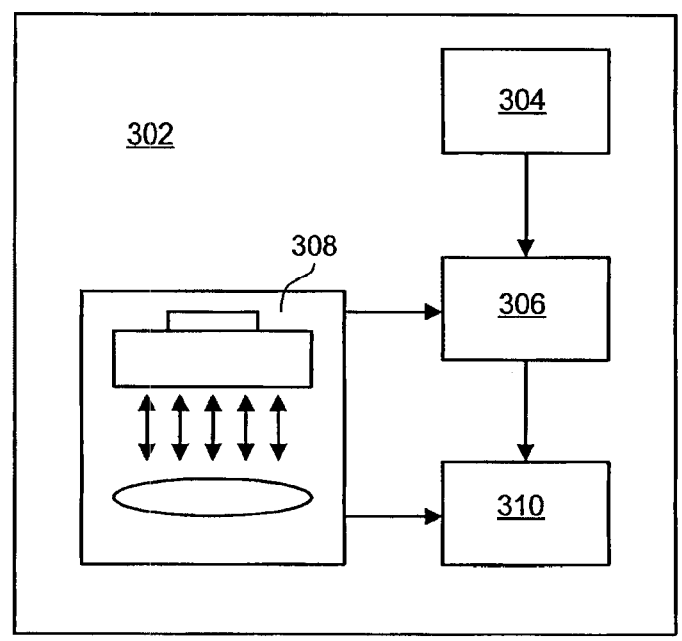
FIG. 3 is a schematic functional illustration of a configuration optimizer to carry out the process illustrated in FIG. 2.

As illustrated schematically in FIG. 3, the functionality may be implemented in a lithography apparatus by means of a configuration optimizer 302 (which may be implemented by a computer) that comprises: an analyzer 304 configured to analyze a target device pattern to be formed on a substrate by the lithogaphy apparatus to identify a plurality of instances of a candidate device feature in the target device pattern, and repeat the analyzing for different candidate device features; a selector 306 configured to select the one or more candidate device features for which the plurality of instances identified in the analyzing matches a selection criterion or criteria; a measuring device 308 configured to determine a set of errors comprising the differences between a measured value for a particular property of each instance of the selected device feature and a target value for the property in a device pattern produced using the lithography apparatus or in a patterning device MA to produce the device pattern using the lithography apparatus; and a fitting module 310 configured to iteratively vary the configuration of the lithography apparatus in a simulation in order to determine a configuration that improves the set of errors in a predicted device pattern.

Figure 4:
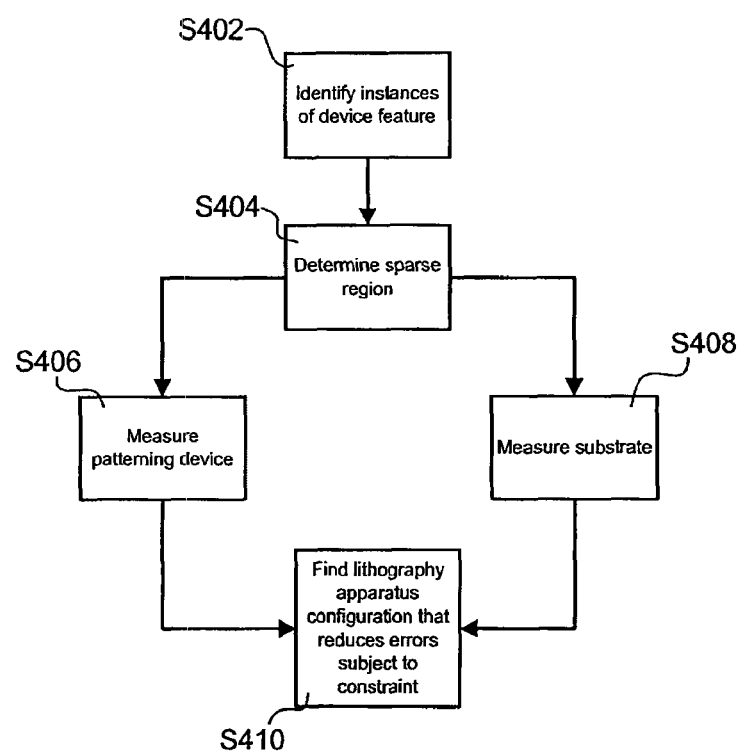
FIG. 4 depicts a further example process to obtain an improved configuration for a lithography apparatus, wherein a target error profile for sparse regions is used in the optimization phase.

FIG. 4 illustrates an approach to deal with the situation where the target device pattern comprises sparse regions, defined as regions in which a device feature to be used to improve the configuration of the lithography apparatus is only present at a very low spatial density or is not present at all. The approach may be used in isolation or in combination with any of the variations described above. In particular, although the approach does not require the equivalent of steps S204, S206 and S208 for selecting the most suitable one or more device features to use in the optimization process, these steps could optionally be included.

The approach of FIG. 4 may be particularly useful, for example, where the target device pattern is for a memory chip or similar. Such device patterns are typically very repetitive in a central zone, where the one or more device features responsible for the storage blocks are contained, but much more random in a peripheral area where connections to the storage blocks are defined. The high degree of repetition in the central zone makes it possible to easily select a large number of evenly spread instances of one or more given device features on which to base an optimization process, but relatively little information about the peripheral region may be available. Such an optimization process may lead to a configuration for the lithography apparatus that achieves high accuracy in the central zone but the peripheral region may be relatively poor or may even be degraded by the correction process.

This problem may be addressed by imposing a constraint or target on the optimization process that involves a certain range of characteristics to be achieved in a sparse region (e.g. a peripheral region). The approach limits degradation in the sparse region without substantially limiting the improvements that are possible in a non-sparse region (e.g. a central region).

In step S402, a target device pattern to be formed on a substrate W by a given lithography apparatus is analyzed in order to identify a plurality of instances of one or more device features. Any number of the instances may be chosen, for example at least 1% of the total number of instances of the device feature present in the target device pattern may be chosen, desirably 10% or more, 50% or more or all of the instances.

In step S404, the target device pattern is analyzed further in order to identify a sparse region in which the number of instances of the device feature per unit area (the feature density) is below a particular threshold. For example, the particular threshold may be 50% or less of the average density in the whole target device pattern, desirably 10% or less or 1% or less.

The process then passes to step S406 or S408, where measurements are carried out to determine a set of differences (also referred to as a set or errors) between a measured value for a particular property (e.g. critical dimension) of each instance of the device feature and a target value for the property. Where the particular property is a critical dimension, the set of errors will be a set of deviations in the critical dimension, for example. The methods of steps S406 and S408 correspond to those described above with reference to steps S210 and S212.

In step S410 an optimization routine is performed to determine a configuration of the lithography apparatus that improves the set of errors. The process performed is similar to that described above with reference to step S214, except that there is no requirement that the device features be chosen according to any special selection criteria (although this could be done if desired), and a new constraint or target is imposed on the predicted error profile in the sparse region.

The step of determining a sparse region S404 is not essential and may be omitted. In this case, the optimization routine will be carried out subject to the constraint or target that a predicted error profile for instances of a device feature other than the instances for which errors are obtained in one or both of the measurement steps S406 and S408 approach a target error profile. In other words, the target error profile will apply to instances of a device pattern for which measurement data is not available. However, other information about these instances may be known or estimated, for example their sensitivity to a particular change in the configuration of the lithography apparatus, for example the sensitivity of a critical dimension of these features to change in the maximum dose or depth of focus may be known.

The constraint or target may be such that the variations in the lithography apparatus configuration that are considered in the optimization algorithm are restricted to those that lead to a predicted error profile (i.e. a positional variation in an expected error in a property of the device pattern, such as a positional variation in the critical dimension relative to a target value) that falls within a tolerance margin of a target error profile (i.e. a constraint). Alternatively, the constraint or target may be a target error profile (i.e. a target). For example, the optimization algorithm may artificially insert data points (i.e. data points which do not correspond to measurements of errors in a device feature), for example in a sparse region, where this is determined, at a density corresponding to the average density of the instances of the device feature in the non-sparse regions for which error measurements have been carried out, and allocate error values to the artificial data points that correspond to the target error profile. The artificially inserted error values then act as "targets" for the optimization algorithm, which will try to find a configuration that corrects these errors. The combination of the sparse region with the artificial data points and the non-sparse region with the real data points (from the measurement process S406 or S408) can then be used as the input to the optimization routine. For example, the optimization routine may determine the set of local deviations in a property (e.g. local deviations in maximum dose or depth of focus) of a simulated patterned radiation beam that would correct the set of errors represented by the combination of measured and artificial data points, and vary one or more properties of the lithography apparatus until a best fit to the set of deviations is achieved.

In an exemplary embodiment, the target error profile is a spatially uniform error profile (for example the target may be that an error in the critical dimension is a constant value throughout a sparse region). This target error profile is relatively simple to apply and can achieve significant improvements in the accuracy of the device pattern, particularly in a sparse region where these are determined and the target error profile is applied to them, relative to the case where no attempt is made to take account of these areas.

The target error profile may define a variation with position of one or more of the following: a dimension of a characteristic geometrical portion of a device feature relative to a nominal value, a width of a line, a distance between two lines, the accuracy of the positional placement of a device feature, and/or the accuracy of orientation of a device feature.

According to a variation, the optimization step S410 comprises determining the set of local deviations in a property (e.g. local maximum dose or depth of focus) of a simulated patterned radiation beam produced by the lithography apparatus that would correct the set of errors (e.g. error in the critical dimension) associated with the instances of one or more device features measured in the measuring step, and carrying out a best fit to the set of local deviations (i.e. finding a configuration of the lithography apparatus that produces a patterned radiation beam that matches the set of local deviations as closely as possible). In this scenario, the optimization routine may take into account the expected sensitivity (of the critical dimension, for example) of instances of one or more device features that are not measured in the measuring step to change in a property of the patterned radiation beam that is varied as part of the optimization (e.g. local maximum dose or depth of focus). For example, in the case where an error in the critical dimension of a particular geometric feature (e.g. line width) of a device feature is measured in steps S406 and S408 (for example in a non-sparse region), and a variation in the maximum dose is the property of the patterned radiation beam that is used to correct the error, the sensitivity of a corresponding critical dimension of instances of one or more device features that are not measured, for example the line width of a device feature in a sparse region, to change in the maximum dose is taken into account in the fitting algorithm. This approach can significantly improve the quality of the fit at positions for which no measurement data is available. For example, in the case of a sparse region this may be because the nature of the device pattern in the sparse region is fundamentally different to that in a non-sparse region, resulting in an average sensitivity that is significantly different. This may be the case for a memory device, for example, where the dose sensitivity of the critical dimension in the peripheral (sparse) region may be significantly different to the dose sensitivity of the critical dimension in a central (non-sparse) region.

More generally, the expected sensitivity of a property measured in steps S406 and S408 to change in a corrective property of the patterned radiation beam can be determined from experiment or simulation.

At least steps S402, S404 and S410 (at least partially steps S406 and S408 also) can be carried out using computer, the hardware associated with which (CPU, RAM, ROM, etc.) is well known to the skilled person. Software code may be provided to instruct the computer to carry out all of the steps that are required. The software code may be stored on a computer readable medium, such as RAM, ROM or a DVD, and supplied to the computer by means of a suitable reader, or by a data connection over a network.

Figure 5:
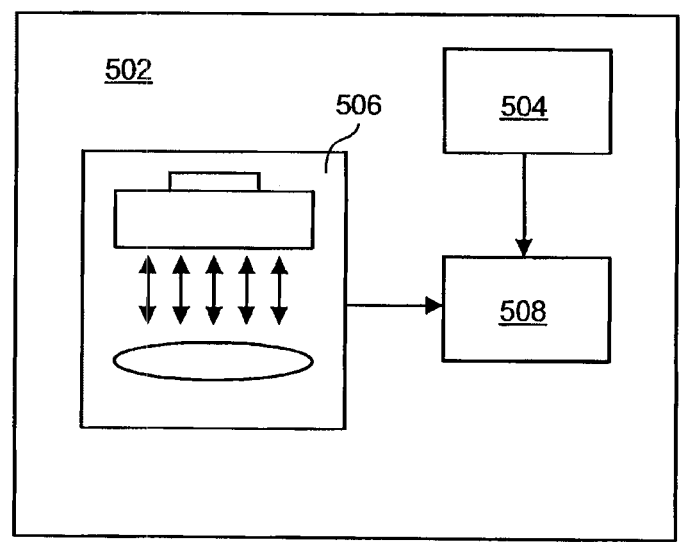
FIG. 5 is a schematic functional illustration of a configuration optimizer to carry out the process illustrated in FIG. 4.

As illustrated schematically in FIG. 5, the functionality may be implemented in a lithography apparatus by means of a configuration optimizer 502 (which may be implemented by a computer) that comprises: an analyzer 504 configured to analyze a target device pattern to be formed on a substrate W by the lithography apparatus to identify a plurality of instances of a device feature in the target device pattern; a measuring device 506 configured to determine a set of errors comprising the differences between a measured value for a particular property of each instance of the device feature and a target value for the property in a device pattern produced using the lithography apparatus or a simulation of the lithography apparatus or in a patterning device MA to produce the device pattern using the lithography apparatus; and a fitting module 508 configured to iteratively vary the configuration of the lithography apparatus in a simulation in order to determine a configuration that improves the set of errors in a predicted device pattern, subject to the constraint or target discussed above with reference to step S410.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The invention may further be described using the following clauses:

1. A method for determining an improved configuration for a lithography apparatus, the method comprising:

analyzing a target device pattern to be imaged on a substrate by a lithography apparatus to identify a plurality of instances of a device feature in the target device pattern;

measuring a device pattern produced using the lithography apparatus, or measuring a patterning device for use in the lithography apparatus, in order to obtain a set of errors comprising the differences between a measured value of a particular property of each instance of the plurality of instances and a target value for the property; and adapting the configuration of the lithography apparatus to improve the set of errors, the adapting being carried out in a manner that satisfies a constraint or target, the constraint or target being that an error profile, applicable at instances of a device feature other than the instances for which errors are obtained in the measuring step, approaches a target error profile.

2. The method according to clause 1, wherein the adapting the configuration of the lithography apparatus comprises iteratively varying the configuration of the lithography apparatus in a simulation in order to determine a configuration that improves the set of errors, the step of iteratively varying being carried out in a manner that satisfies the constraint or target, the error profile that approaches a target error profile being an error profile predicted in the simulation.

3. The method according to clause 1 or clause 2, wherein the adapting comprises determining the set of local deviations in a property of a simulated patterned radiation beam produced by the lithography apparatus that would correct the set of errors obtained in the measuring step, and carrying out a best fit to the set of local deviations; and the adapting takes into account the sensitivity of the particular property, when applied to instances of a device feature other than the instances for which errors are obtained in the measuring step, to change in the property of the simulated patterned radiation beam.

4. The method according to any of clauses 1-2, further comprising identifying a sparse region in the target device pattern, defined as a region in which the number of instances per unit area of a device feature for which instances are identified in the analyzing step is below a particular threshold, the target error profile being defined at least in the sparse region.

5. The method according to any of clauses 1-4, wherein the target error profile is a spatially uniform error profile.

6. The method according to any of clauses 1-5, wherein the target error profile comprises a variation with position of an error in at least one of the following: a line width in a device feature, a line separation in a device feature, the positional placement accuracy of a device feature, and the orientation accuracy of a device feature.

7. The method according to any of clauses 1-6, wherein the particular property of the instances of a device feature comprises at least one selected from the following: a line width in a device feature, a line separation in a device feature, the positional placement accuracy of a device feature, and/or the orientation accuracy of a device feature.

8. The method according to any of clauses 1-7, wherein adapting the configuration of the lithography apparatus comprises changing one or more properties of the lithography apparatus that influence the variation with position of the depth of focus within the plane of the substrate.

9. The method according to any of clauses 1-8, wherein adapting the configuration of the lithography apparatus comprises changing one or more properties of the lithography apparatus that influence a maximum dose profile, or a dose fingerprint, at the substrate plane, the one or more properties being such as to modify a portion of a radiation beam of the lithography apparatus prior to the portion of the radiation beam interacting with a patterning device, to modify a dose profile incident on the patterning device, or after the portion of the radiation beam has interacted with the patterning device.

10. The method according to any of clauses 1-9, wherein adapting the configuration of the lithography apparatus comprises varying at least one selected from the following: 1) the magnification of the lithography apparatus; 2) a setting of an illuminator of the lithography apparatus, the illuminator being configured to condition a radiation beam from a source prior to the radiation beam being directed onto the patterning device; and/or 3) a setting of the lithography apparatus that defines the numerical aperture.

11. A computer-readable medium comprising code to instruct a computer to carry out a method for determining an improved configuration of a lithography system, comprising:

analyzing a target device pattern to be imaged on a substrate by a lithography apparatus to identify a plurality of instances of a device feature in the target device pattern;

obtaining data from measurements of a device pattern produced using the lithography apparatus, or from measurements of a patterning device for use in the lithography apparatus, comprising a set of errors comprising differences between a measured value of a particular property of each instance of the plurality of instances and a target value for the property; and adapting the configuration of the lithography apparatus to improve the set of errors, the adapting being carried out in a manner that satisfies a constraint or target, the constraint or target being that an error profile, applicable at instances of a device feature other than the instances for which errors are obtained in the measuring step, approach a target error profile.

12. A lithography apparatus comprising:

a support constructed to support a patterning device, the patterning device being capable of imparting the radiation beam with a pattern in its cross-section to form a patterned radiation beam;

a projection system configured to project the patterned radiation beam onto a target portion of a substrate; and a configuration optimizer to optimize the configuration of the lithography apparatus, the configuration optimizer comprising:

an analyzer configured to analyze a target device pattern to be imaged on a substrate by the lithography apparatus to identify a plurality of instances of a device feature in the target device pattern;

a measuring device configured to measure a device pattern produced using the lithography apparatus, or measure a patterning device for use in the lithography apparatus, in order to obtain a set of errors comprising differences between a measured value of a particular property of each instance of the identified plurality of instances of the device feature and a target value for the property; and a fitting module configured to adapt the configuration of the lithography apparatus to improve the set of errors, the adapting being carried out in a manner that satisfies a constraint or target, the constraint or target being that an error profile, applicable at instances of a device feature other than the instances for which errors are obtained in the measuring step, approaches a target error profile.

13. A method for determining an improved configuration for a lithography apparatus, the method comprising:

analyzing a target device pattern to be imaged on a substrate by a lithography apparatus to identify a plurality of instances of a candidate device feature in the target device pattern;

repeating the analyzing step for a different candidate device feature;

selecting the candidate device feature for which the plurality of instances identified in the analyzing step matches a selection criterion or criteria;

measuring a device pattern produced using the lithography apparatus, or measuring a patterning device for use in the lithography apparatus, in order to obtain a set of errors comprising differences between a measured value of a particular property of each instance of the identified plurality of instances of the selected device feature and a target value for the property; and adapting the configuration of the lithographic apparatus to improve the set of errors.

14. The method according to any of clause 13, further comprising determining the set of local deviations in a property of a simulated patterned radiation beam produced by the lithography apparatus that would correct the set of errors associated with the selected device feature.

15. The method according to clause 14, wherein the iteratively varying step comprises varying one or more properties of the lithography apparatus in order to find a best fit to the set of local deviations.

16. The method according to clause 13, wherein the selecting step uses a plurality of the selection criterion.

17. The method according to clause 13, wherein the particular property of the instances of a device feature comprises at least one selected from the following: a line width in a device feature, a line separation in a device feature, the positional placement accuracy of a device feature, and/or the orientation accuracy of a device feature.

18. The method according to clause 13, wherein adapting the configuration of the lithography apparatus comprises changing one or more properties of the lithography apparatus that influence the variation with position of the depth of focus within the plane of the substrate.

19. The method according to clause 13, wherein adapting the configuration of the lithography apparatus comprises changing one or more properties of the lithography apparatus that influence a maximum dose profile, or a dose fingerprint, at the substrate plane, the one or more properties being such as to modify a portion of a radiation beam of the lithography apparatus prior to the portion of the radiation beam interacting with a patterning device, to modify a dose profile incident on the patterning device, or after the portion of the radiation beam has interacted with the patterning device.

20. The method according to clause 13, wherein adapting the configuration of the lithography apparatus comprises varying at least one selected from the following: 1) the magnification of the lithography apparatus; 2) a setting of an illuminator of the lithography apparatus, the illuminator being configured to condition a radiation beam from a source prior to the radiation beam being directed onto the patterning device; and/or 3) a setting of the lithography apparatus that defines the numerical aperture.

The descriptions above are intended to be illustrative, not limiting. Thus, it will be apparent to one skilled in the art that modifications may be made to the invention as described without departing from the scope of the claims set out below.

The invention claimed is:

1. A method for determining an improved configuration for a lithography apparatus, the method comprising:

analyzing a target device pattern to be imaged on a substrate by a lithography apparatus to identify a plurality of instances of a candidate device feature in the target device pattern;

repeating the analyzing step for a different candidate device feature;

selecting the candidate device feature for which the plurality of instances identified in the analyzing step matches a selection criterion or criteria;

measuring a device pattern produced using the lithography apparatus, or measuring a patterning device for use in the lithography apparatus, in order to obtain a set of errors comprising differences between a measured value of a particular property of each instance of the identified plurality of instances of the selected device feature and a target value for the property; and adapting the configuration of the lithographic apparatus to improve the set of errors.

2. The method according to claim 1, wherein adapting the configuration of the lithography apparatus comprises iteratively varying the configuration of the lithography apparatus in order to determine a configuration that improves the set of errors.

3. The method according to claim 2, wherein iteratively varying comprises iteratively varying the configuration of the lithography apparatus in a simulation in order to determine a configuration that improves the set of errors.

4. The method according to claim 1, further comprising determining the set of local deviations in a property of a simulated patterned radiation beam produced by the lithography apparatus that would correct the set of errors associated with the selected device feature.

5. The method according to claim 4, wherein the property of the simulated patterned radiation beam comprises the local maximum radiation dose.

6. The method according to claim 4, wherein the property of the simulated patterned radiation beam comprises the local depth of focus.

7. The method according to claim 1, comprising:
for each of the candidate device features analyzed in the analyzing step:
measuring a device pattern produced using the lithography apparatus, or measuring a patterning device for use in the lithography apparatus, in order to obtain a set of errors comprising the differences between a measured value of a particular property of each instance of the identified plurality of instances of the candidate device feature and a target value for the property; and
determining the set of local deviations in a property of a simulated patterned radiation beam produced by the lithography apparatus that would correct the set of errors associated with the candidate device feature,
wherein the selection criterion or criteria comprises a requirement that is based on a property of the set of local deviations.

8. The method according to claim 7, wherein the selection criterion or criteria comprises at least one selected from the following: 1) that the set of local deviations for the candidate feature comprises a deviation that is larger than a particular threshold; 2) that the set of local deviations for the candidate feature comprises an average deviation that is larger than an average deviation in the set of local deviations for any of the other candidate device features; and/or 3) that the set of local deviations for the candidate feature comprises an average deviation that is larger than a particular threshold.

9. The method according to claim 7, wherein the selection criterion or criteria comprises at least one selected from the following: 1) that the difference between the smallest deviation and the largest deviation in the set of local deviations for the candidate feature is larger than a particular threshold; and/or 2) that the difference between the smallest deviation and the largest deviation in the set of local deviations for the candidate feature is larger than the difference between the smallest deviation and the largest deviation in the set of local deviations for any of the other candidate features.

10. The method according to claim 7, wherein the selection criterion or criteria comprises at least one selected from the following: 1) that the set of local deviations for the candidate feature comprises a deviation that is smaller than a particular threshold; 2) that the set of local deviations for the candidate feature comprises an average deviation that is smaller than an average deviation in the set of local deviations for any of the other candidate device features; and/or 3) that the set of local deviations for the candidate feature comprises an average deviation that is smaller than a particular threshold.

11. The method according to claim 7, wherein the selection criterion or criteria comprises at least one selected from the following: 1) that the difference between the smallest deviation and the largest deviation in the set of local deviations for the candidate feature is smaller than a particular threshold; and/or 2) that the difference between the smallest deviation and the largest deviation in the set of local deviations for the candidate feature is smaller than the difference between the smallest deviation and the largest deviation in the set of local deviations for any of the other candidate features.

12. The method according to claim 5, wherein the selection criterion or criteria comprises at least one selected from the following: 1) that the smallest, largest or average value of the sensitivity of a particular property of each instance of the candidate device feature to change in the property of the simulated patterned radiation beam is larger than a particular threshold; and/or 2) that the smallest, largest or average value of the sensitivity of the particular property of each instance of the candidate device feature to change in the property of the simulated patterned radiation beam is smaller than a particular threshold.

13. The method according to claim 1, wherein a plurality of candidate device features is selected in the selecting step and the adapting comprises seeking a configuration that improves the sets of errors associated with all of the selected device features.

14. The method according to claim 1, wherein the selection criterion or criteria comprises the requirement that the number of instances of the candidate device feature in the target device pattern is higher than a particular threshold.

15. The method according to claim 1, wherein the selection criterion or criteria comprises the requirement that the variance in the number of instances of the candidate device feature per unit area is lower than a particular threshold.

16. The method according to claim 1, comprising:
for each of the candidate device features analyzed in the analyzing step: measuring a device pattern produced using the lithography apparatus, or measuring a patterning device for use in the lithography apparatus, in order to obtain a set of errors comprising the differences between a measured value of a particular property of each instance of the candidate device feature and a target value for the property, and
wherein the selection criterion or criteria comprises at least one selected from the following: 1) that the mean of the measured set of errors is larger than a particular threshold; 2) that the variance of the measured set of errors is larger than a particular threshold; 3) that the mean of the measured set of errors is smaller than a particular threshold; and/or 4) that the variance of the measured set of errors is smaller than a particular threshold.

17. The method according to claim 1, wherein the adapting the configuration of the lithography apparatus is carried out in a manner that satisfies a constraint or target, the constraint or target being that an error profile, applicable at instances of a device feature other than the instances for which errors are obtained in the measuring step, approaches a target error profile.

18. The method according to claim 17, further comprising identifying a sparse region in the target device pattern, defined as a region in which the number of instances per unit area of a device feature for which instances are identified in the analyzing step is below a particular threshold, the target error profile being defined at least in the sparse region.

19. A non-transitory computer-readable medium comprising code to instruct a computer to carry out a method for determining an improved configuration of a lithography apparatus, the method comprising:
- analyzing a target device pattern to be imaged on a substrate by a lithography apparatus to identify a plurality of instances of a candidate device feature in the target device pattern;
- repeating the analyzing step for a different candidate device feature;
- selecting the candidate device feature for which the plurality of instances identified in the analyzing step matches a selection criterion or criteria;
- obtaining data from measurements of a device pattern produced using the lithography apparatus, or from measurements of a patterning device for use in the lithography apparatus, comprising a set of errors comprising differences between a measured value of a particular property of each instance of the identified plurality of instances of the selected device feature and a target value for the property; and
- adapting the configuration of the lithographic apparatus to improve the set of errors.

20. A lithography apparatus comprising:
- a support constructed to support a patterning device, the patterning device being capable of imparting the radiation beam with a pattern in its cross-section to form a patterned radiation beam;
- a projection system configured to project the patterned radiation beam onto a target portion of a substrate; and
- a configuration optimizer configured to optimize the configuration of the lithography apparatus, the configuration optimizer comprising:
- an analyzer configured to analyze a target device pattern to be imaged on a substrate by the lithography apparatus to identify a plurality of instances of a candidate device feature in the target device pattern, and repeat the analyzing step for a different candidate device feature;
- a selector configured to select the candidate device feature for which the plurality of instances identified in the analyzing step matches a selection criterion or criteria;
- a measuring device configured to measure a device pattern produced using the lithography apparatus, or measure a patterning device for use in the lithography apparatus, in order to obtain a set of errors comprising differences between a measured value of a particular property of each instance of the identified plurality of instances of the selected device feature and a target value for the property; and
- a fitting module configured to adapt the configuration of the lithography apparatus to improve the set of errors.

* * * * *